United States Patent
Takeuchi et al.

(10) Patent No.: US 11,152,898 B2
(45) Date of Patent: Oct. 19, 2021

(54) RADIO-FREQUENCY CIRCUIT AND COMMUNICATION DEVICE

(71) Applicant: Murata Manufacturing Co., Ltd., Kyoto (JP)

(72) Inventors: Morio Takeuchi, Nagaokakyo (JP); Syunsuke Kido, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/887,221

(22) Filed: May 29, 2020

(65) Prior Publication Data

US 2020/0382081 A1    Dec. 3, 2020

(30) Foreign Application Priority Data

May 30, 2019 (JP) .............................. JP2019-101502

(51) Int. Cl.
*H03F 3/19* (2006.01)
*H03F 3/195* (2006.01)
*H03F 3/72* (2006.01)
*H04B 1/18* (2006.01)

(52) U.S. Cl.
CPC .............. *H03F 3/195* (2013.01); *H03F 3/72* (2013.01); *H04B 1/18* (2013.01); *H03F 2200/294* (2013.01); *H03F 2200/451* (2013.01)

(58) Field of Classification Search
CPC combination set(s) only.
See application file for complete search history.

(56) References Cited

U.S. PATENT DOCUMENTS

| | | | |
|---|---|---|---|
| 8,138,853 B2* | 3/2012 | Chu | H04B 1/18 333/101 |
| 10,420,161 B1* | 9/2019 | Sava | H04W 76/15 |
| 10,715,091 B2* | 7/2020 | Kim | H03F 3/189 |
| 2017/0214371 A1* | 7/2017 | Noori | H03F 1/42 |
| 2019/0229764 A1* | 7/2019 | Kang | H04B 1/406 |
| 2019/0229775 A1* | 7/2019 | Wloczysiak | H04B 1/0057 |
| 2019/0273314 A1* | 9/2019 | Wloczysiak | H03H 7/0161 |

FOREIGN PATENT DOCUMENTS

| | | |
|---|---|---|
| JP | 2018-19392 A | 2/2018 |
| WO | 2008/087697 A1 | 7/2008 |
| WO | 2019/244757 A1 | 12/2019 |

* cited by examiner

*Primary Examiner* — Junpeng Chen
(74) *Attorney, Agent, or Firm* — Pearne & Gordon LLP

(57) ABSTRACT

A radio-frequency circuit includes a first switch which includes a common terminal, a first selection terminal, and a second selection terminal, and switches between connecting the common terminal and the first selection terminal and connecting the common terminal and the second selection terminal; a first low-noise amplifier including an input terminal connected to the first selection terminal, and a second low-noise amplifier including an input terminal connected to the second selection terminal. The frequency band in which the first low-noise amplifier amplifies a radio-frequency signal by at least a predetermined gain includes the frequency band in which the second low-noise amplifier amplifies a radio-frequency signal by at least a predetermined gain.

16 Claims, 8 Drawing Sheets

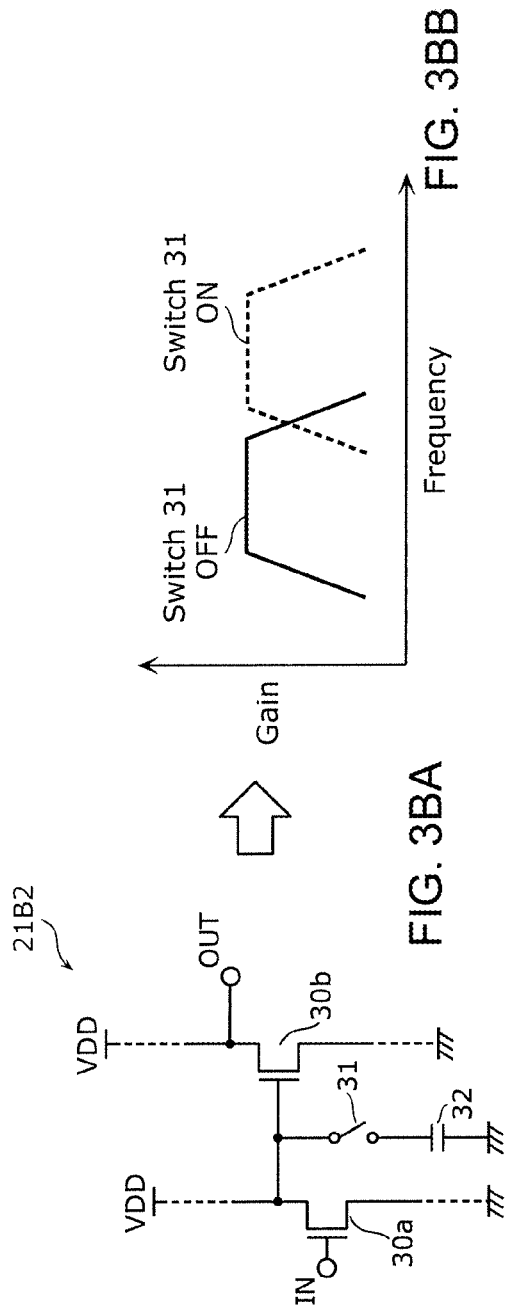

RADIO-FREQUENCY CIRCUIT AND COMMUNICATION DEVICE

CROSS REFERENCE TO RELATED APPLICATION

The present application is based on and claims priority of Japanese Patent Application No. 2019-101502 filed on May 30, 2019. The entire disclosure of the above-identified application, including the specification, drawings and claims is incorporated herein by reference in its entirety.

TECHNICAL FIELD

The present disclosure relates to a radio-frequency circuit and a communication device.

BACKGROUND

In recent communication services, there is a demand for radio-frequency front-end circuits that propagate radio-frequency signals of a plurality of communication bands with a high quality for high-volume and high-speed communication.

Patent Literature (PTL) 1 discloses a radio-frequency front-end circuit capable of multiplexing radio-frequency signals of a plurality of communication bands with low loss. PTL 1 (FIG. 4), for example, discloses LNA 31 that is capable of amplifying radio-frequency signals of communication band Bp and communication band Bd. Switch 22B switches between the connection between the signal path of communication band Bp and LNA 31 and the connection between the signal path of communication band Bd and LNA 31.

PTL 1: Japanese Unexamined Patent Application Publication No. 2018-19392

BRIEF SUMMARY

In recent years, following the change of communication bands to wide bands and high frequencies, the bandwidths and frequency bands of communication bands to be handled are becoming diversified. On the other hand, as the bandwidths and frequency bands for which a single low-noise amplifier (LNA) has to perform amplification become extensive, amplification performances, such as a gain and distortion characteristics, and a power consumption deteriorate.

Based on t the above viewpoint, in the radio-frequency front-end circuit disclosed in Patent Literature 1, even when the bandwidths and frequency bands for which the single LNA has to perform amplification become extensive, ensuring high amplification performances for all of the plurality of communication bands is desired.

In view of this, the present disclosure provides a radio-frequency circuit and a communication device that are capable of amplifying, with high amplification performances, radio-frequency signals of a plurality of communication bands.

A radio-frequency circuit according to an aspect of the present disclosure includes: a first switch including a common terminal, a first selection terminal, and a second selection terminal, the first switch configured to switch between connecting the common terminal and the first selection terminal and connecting the common terminal and the second selection terminal; a first low-noise amplifier including an input terminal connected to the first selection terminal; and a second low-noise amplifier including an input terminal connected to the second selection terminal, wherein a frequency band in which the first low-noise amplifier amplifies a radio-frequency signal by at least a predetermined gain includes a frequency band in which the second low-noise amplifier amplifies a radio-frequency signal by at least a predetermined gain.

The present disclosure can provide radio-frequency circuits and communication devices that amplify, with high amplification performances, radio-frequency signals of a plurality of communication bands.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3BA is an outline diagram illustrating an example of a circuit configuration.

FIG. 3BB illustrates example gain-frequency characteristics of a second low-noise amplifier according to Variation embodiment 1 of the embodiment.

DETAILED DESCRIPTION

Figure 1:
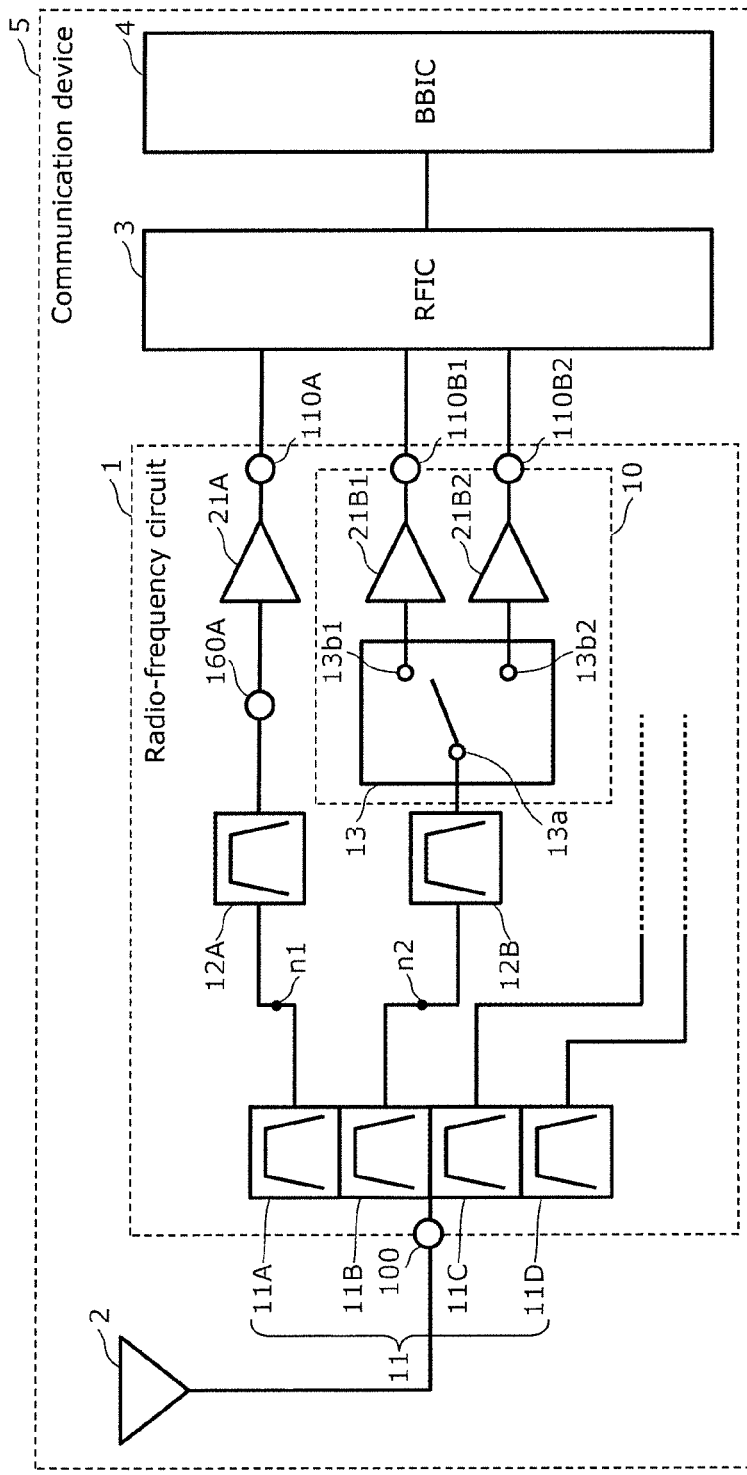
FIG. 1 is an example of a circuit configuration diagram of a radio-frequency circuit and a communication device according to an embodiment.

Hereinafter, exemplary embodiments of the present disclosure will be described in detail with reference to the drawings. It should be noted that each of the subsequently described exemplary embodiments and variations shows a generic or a specific example. The numerical values, shapes, materials, elements, the arrangement and connection of the elements, and others indicated in the following exemplary embodiments and variations are mere examples, and therefore are not intended to limit the present disclosure. Among the elements described in the following exemplary embodiments and variations, elements not recited in any one of the independent claims are described as optional elements. In addition, the sizes of the elements and the ratio of the sizes illustrated in the drawings are not necessarily accurate.

EMBODIMENT

1. Configuration of Radio-Frequency Circuit 1 and Communication Device 5

FIG. 1 is an example of a circuit configuration diagram of radio-frequency circuit 1 and communication device 5 according to the embodiment. As illustrated in the figure, communication device 5 includes radio-frequency circuit 1, antenna element 2, RF signal processing circuit (RFIC) 3, and baseband signal processing circuit (BBIC) 4.

Radio-frequency circuit 1 includes common terminal 100, multiplexer 11, filters 12A and 12B, switch 13, low-noise amplifiers 21A, 21B1 and 21B2, reception output terminals 110A, 110B1, and 110B2.

Switch 13, which is an example of a first switch, includes common terminal 13a, selection terminal 13b1 (a first selection terminal) and selection terminal 13b2 (a second selection terminal) and switches between the connection between common terminal 13a and selection terminal 13b1 and the connection between common terminal 13a and selection terminal 13b2. Switch 13 is for example a single pole, double throw (SPDT) switch.

Low-noise amplifier 21B1, which is an example of a first low-noise amplifier, includes an input terminal (a first input terminal) connected to selection terminal 13b1 and an output terminal (a first output terminal) connected to reception output terminal 110B1 and amplifies a radio-frequency signal input via common terminal 13a and selection terminal 13b1 and outputs the amplified radio-frequency signal from reception output terminal 110B1 to RFIC 3. Low-noise amplifier 21B1 is capable of amplifying radio-frequency signals of communication band B1, for example.

Low-noise amplifier 21B2, which is an example of a second low-noise amplifier, includes an input terminal (a second input terminal) connected to selection terminal 13b2 and an output terminal (a second output terminal) connected to reception output terminal 110B2 and amplifies a radio-frequency signal input via common terminal 13a and selection terminal 13b2 and outputs the amplified radio-frequency signal from reception output terminal 110B2 to RFIC 3. Low-noise amplifier 21B2 is capable of amplifying radio-frequency signals of communication band B2, for example.

Here, the frequency band in which low-noise amplifier 21B1 amplifies a radio-frequency signal by at least a predetermined gain includes the frequency band in which low-noise amplifier 21B2 amplifies a radio-frequency signal by at least the predetermined gain. In one embodiment, communication band B1 includes communication band B2.

According to this configuration, the frequency band in which at least the predetermined gain is achieved is narrower for low-noise amplifier 21B2 than for low-noise amplifier 21B1, and thus low-noise amplifier 21B2 is more capable of enhancing amplification performances such as a maximum gain, a power consumption, and a signal distortion. Therefore, it is possible to obtain high amplification performances, such as a high gain, a low power consumption, and a low signal distortion in comparison to, for example, the case where the single low-noise amplifier 21B1 amplifies a radio-frequency signal of communication band B1 corresponding to the frequency band in which low-noise amplifier 21B1 is capable of amplifying by at least a predetermined gain and a radio-frequency signal of communication band B2 corresponding to the frequency band in which low-noise amplifier 21B2 is capable of amplifying by at least a predetermined gain.

Low-noise amplifier 21A includes an input terminal connected to terminal 160A and an output terminal connected to reception output terminal 110A, and amplifies a radio-frequency signal input via terminal 160A and outputs the amplified radio-frequency signal from the output terminal to reception output terminal 110A. Low-noise amplifier 21A is capable of amplifying radio-frequency signals of communication band A, for example. It should be noted that the frequencies of communication band A and communication band B1 do not overlap each other, and the frequencies of communication band A and communication band B2 do not overlap each other.

Filter 12B, which is an example of a first filter, is a radio-frequency filter that includes an output terminal connected to common terminal 13a of switch 13 and an input terminal connected to connection node n2.

According to this configuration, unnecessary waves of radio-frequency signals to be input to low-noise amplifiers 21B1 and 21B2 can be suppressed upstream of low-noise amplifiers 21B1 and 21B2, and thus the S/N ratio of the radio-frequency signals output from low-noise amplifiers 21B1 and 21B2 improves.

Filter 12A is a radio-frequency filter that includes an output terminal connected to terminal 160A and an input terminal connected to connection node n1.

According to this configuration, unnecessary waves of radio-frequency signals to be input to low-noise amplifier 21A can be suppressed upstream of low-noise amplifier 21A, and thus the S/N ratio of the radio-frequency signals output from low-noise amplifier 21A improves.

Multiplexer 11 includes filters 11A, 11B, 11C, and 11D. It should be noted that the respective passbands of filters 11A to 11D do not overlap one another.

Filter 11A is a radio-frequency filter that includes an input terminal connected to common terminal 100 and an output terminal connected to connection node n1. Filter 11B is a radio-frequency filter that includes an input terminal connected to common terminal 100 and an output terminal connected to connection node n2. Filter 11C is a radio-frequency filter that includes an input terminal connected to common terminal 100. Filter 11D is a radio-frequency filter that includes an input terminal connected to common terminal 100.

It should be noted that it is sufficient that multiplexer 11 be configured to multiplex radio-frequency signals of at least two different frequency bands. From this viewpoint, it is sufficient that the number of radio-frequency filters included in multiplexer 11 be two or more.

It should be noted that although the circuit elements to which the output terminal of filter 11C and the output terminal of filter 11D are connected have been omitted in FIG. 1, each may be further connected to a radio-frequency filter.

It should be noted that switch 13 and low-noise amplifiers 21B1 and 21B2 may be realized as radio-frequency module 10 composed of a single chip semiconductor integrated circuit (IC). In addition, the semiconductor IC may include low-noise amplifier 21A.

The semiconductor IC includes, for example, a complementary metal oxide semiconductor (CMOS). Specifically, the semiconductor IC is configured using a silicon on insulator (SOI) structure. According to this, the semiconductor IC can be manufactured at low cost. It should be noted that the semiconductor IC may include at least one of GaAs, SiGe, or GaN. According to this, radio-frequency signals having high quality amplification performance and noise performance can be output.

At least one of filters 11A to 11D may be an acoustic wave filter that includes an acoustic wave resonator. The acoustic wave resonator is, for example, an acoustic wave resonator that uses a surface acoustic wave (SAW) or an acoustic wave resonator that uses a bulk acoustic wave (BAW). Furthermore, at least one of filter 12A or 12B may be an LC filter including at least one of an inductor or a capacitor.

When communication band A and communication bands B1 and B2 are wide bands and the frequency interval (frequency gap) between neighboring communication bands is narrow, configuring filters 11A to 11D disposed upstream using LC filters causes the problem of increased radio-frequency signal propagation loss in multiplexer 11. In contrast, by configuring multiplexer 11 using acoustic wave filters that cause high attenuation of the attenuation band in the passband vicinity, the radio-frequency signals of the respective communication bands can be multiplexed with high isolation even when the respective communication bands are relatively close. Furthermore, although the amount of attenuation decreases in bands which are far from the passband in acoustic wave filters, since LC filters capable of ensuring stable attenuation over a wide band in bands that are far from the passband are used in filters 12A and 12B disposed downstream, it is possible to cause high attenuation in bands that are far from the passband. Therefore, the radio-frequency signals of a plurality of communication bands can be multiplexed with high isolation and low loss.

It should be noted that ratio-frequency circuit 1 according to this embodiment is a reception circuit that propagates radio-frequency signals received by antenna element 2 and outputs the radio-frequency signals to RFIC 3, but may be a transceiver circuit that further includes a transmission circuit.

Furthermore, radio-frequency circuit 1 need not include common terminal 100, multiplexer 11, filters 12A and 12B, and low-noise amplifier 21A.

Hereinafter, elements included in communication device 5 other than radio-frequency circuit 1 will be described.

Antenna element 2 is connected to common terminal 100 of radio-frequency circuit 1 and receives radio-frequency signals. Furthermore, when radio-frequency circuit 1 includes a transmission circuit, antenna element 2 may emit a radio-frequency signal output from RFIC 3 and propagated in radio-frequency circuit 1.

RFIC 3 is an RF signal processing circuit that processes a radio-frequency signal output from radio-frequency circuit 1 via reception output terminal 110A, 110B1, and 110B2. Furthermore, when radio-frequency circuit 1 includes a transmission circuit, RFIC 3 performs, by upconversion, etc., signal processing on a transmission signal input from BBIC 4, and outputs the radio-frequency signal generated by the signal processing to radio-frequency circuit 1. Furthermore, RFIC 3 includes a controller that outputs a control signal for switching the connection state of switch 13, based on the communication band to be used. It should be noted that the controller may be provided outside of RFIC 3, and may be provided, for example, in radio-frequency circuit 1 or BBIC 4.

BBIC 4 is a circuit that performs signal processing using an intermediate frequency band having a lower frequency than a radio-frequency signal propagating in radio-frequency circuit 1. The signal processed by BBIC 4 is, for example, used as image signals for image display or as sound signals for telephone conversation via a speaker.

Figure 2A:
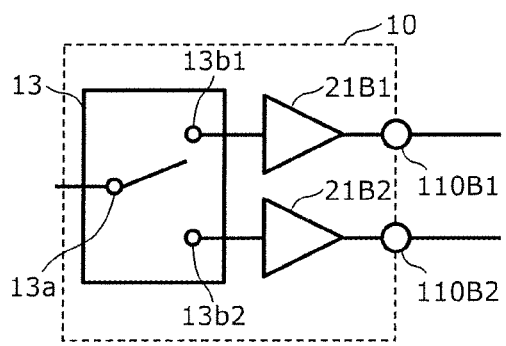
FIG. 2A illustrates an example of a circuit configuration diagram of a first low-noise amplifier, a second low noise amplifier, and a first switch included in the radio-frequency circuit according to the embodiment.

2. Amplification Characteristics of Low-Noise Amplifiers 21B1 and 21B2 According to the Embodiment FIG. 2A illustrates an example of a circuit configuration diagram of low-noise amplifiers 21B1 and 21B2 and switch 13 included in radio-frequency circuit 1 according to the embodiment, and an outline diagram illustrating gain-frequency characteristics of low-noise amplifiers 21B1 and 21B2. FIG. 2A illustrates a circuit configuration of switch 13 and low-noise amplifiers 21B1 and 21B2 included in radio-frequency circuit 1. Furthermore, FIG. 2A illustrates the gain-frequency characteristics of low-noise amplifier 21B1 (solid line) and the gain-frequency characteristics of low-noise amplifier 21B2 (broken line).

Figure 2B:
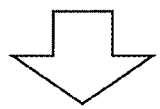
FIG. 2B illustrates gain-frequency characteristics of the first low-noise amplifier and the second low-noise amplifier.
Figure 2B:
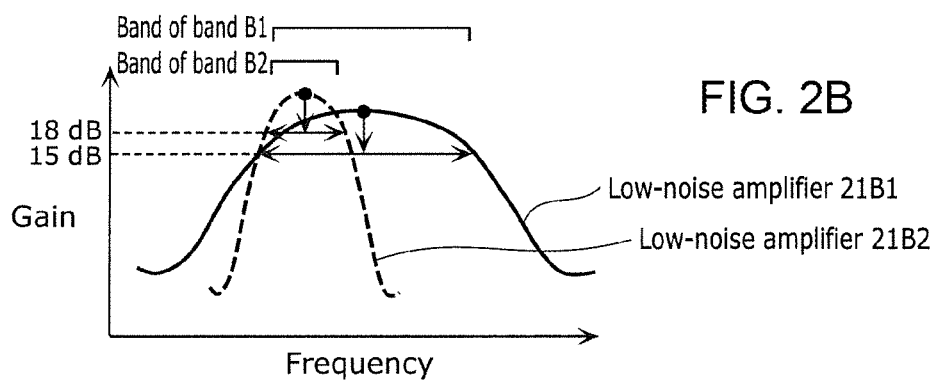

As illustrated in FIG. 2B, the frequency band in which low-noise amplifier 21B1 can amplify by at least a predetermined gain includes the frequency band in which low-noise amplifier 21B2 amplifies radio-frequency signals by the predetermined gain. More specifically, low-noise amplifier 21B1 has, as a possible amplification band, a band (first frequency band) in which low-noise amplifier 21B1 is capable of amplifying radio-frequency signals by at least a gain (15 dB) that is smaller than the maximum gain of low-noise amplifier 21B1 by a predetermined value (for example, 3 dB). Furthermore, low-noise amplifier 21B2 has, as a possible amplification band, a band (second frequency band) in which low-noise amplifier 21B2 is capable of amplifying a radio-frequency signal by at least a gain (18 dB) that is smaller than the maximum gain of low-noise amplifier 21B2 by a predetermined value (for example, 3 dB). Here, the first frequency band of low-noise amplifier 21B1 corresponds to communication band B1 and the second frequency band of low-noise amplifier 21B2 corresponds to communication band B2, and the first frequency band includes the second frequency band. In this case, since the frequency band for which low-noise amplifier 21B2 needs to perform amplification is narrower than that of low-noise amplifier 21B1, low-noise amplifier 21B2 is more capable of enhancing amplification performance such as maximum gain, power consumption, and signal distortion.

It should be noted that, in this embodiment, "the first frequency band includes the second frequency band" is defined as a state corresponding to any one of equations (1) to (3) below. It should be noted that the low-end frequency of the first frequency band is denoted as fL1, the high-end frequency of the first frequency band is denoted as fH1, the low-end frequency of the second frequency band is denoted as fL2, the high-end frequency of the second frequency band is denoted as fH2.

(1) $f_{L1} < f_{L2}$ and $f_{H2} < f_{H1}$
(2) $f_{L1} = f_{L2}$ and $f_{H2} < f_{H1}$
(3) $f_{L1} < f_{L2}$ and $f_{H2} = f_{H1}$ A conventional radio-frequency circuit has a configuration in which a radio-frequency signal of communication band B1 and a radio-frequency signal of communication band B2 are amplified by a single low-noise amplifier 21B1. As such, compared to when the radio-frequency signal of communication band B2 is amplified by low-noise amplifier 21B2, when the radio-frequency signal of communication band B2 is amplified by low-noise amplifier 21B1, amplification performance deteriorates because maximum gain becomes lower, power consumption increases, and signal distortion increases.

In contrast, with radio-frequency circuit 1 according to this embodiment, the radio-frequency signal of communication band B1 and the radio-frequency signal of communication band B2 whose frequencies are in an inclusion relation are amplified by being divided between low-noise amplifier 21B1 and low-noise amplifier 21B2 according to the frequency band of the communication band. For this reason, when amplifying a radio-frequency signal of communication band B2, amplification performance such as high maximum gain, low power consumption, and low signal distortion can be ensured compared to the conventional radio-frequency circuit.

For example, in the fifth-generation mobile communication system (5G), the communication band is being widened compared to that in the fourth-generation mobile communication system (4G). In the initial stages of introduction of 5G, there is a demand for radio-frequency circuits capable of handling both 4G and 5G. In this case, a radio-frequency circuit that simultaneously transfers 4G-long term evolution (LTE) radio-frequency signals and 5G-new radio (NR) radio-frequency signals becomes necessary. For this reason, in radio-frequency circuit 1 according to this embodiment, a 5G-NR communication band is applied as communication band B1 and a 4G-LTE communication band is applied as communication band B1.

For example, n77 (3300 MHz to 4200 MHz) of 5G-NR may be applied as communication band B1, and at least one of B42 (3400 MHz to 3600 MHz), B43 (3600 MHz to 3800 MHz), B48 (3550 MHz to 3700 MHz), or B49 (3550 MHz to 3700 MHz) of 4G-LTE may be applied as communication band B2.

In the case of the above-mentioned conventional radio-frequency circuit, when the radio-frequency signal of the 4G-LTE communication band having a relatively narrow band is amplified by low-noise amplifier 21B1 that has amplification characteristics for a wide band, the maximum gain becomes lower, power consumption increases, and signal distortion increases.

In contrast, with radio-frequency circuit 1 according to this embodiment, the radio-frequency signal of the 5G-NR communication band and the radio-frequency signal of the 4G-LTE communication band whose frequencies are in an inclusion relation are amplified by being divided between low-noise amplifier 21B1 and low-noise amplifier 21B2 according to the frequency band of the communication band. For this reason, when amplifying a radio-frequency signal of a 4G-LTE communication band which is a relatively narrow band, amplification performance such as high maximum gain, low power consumption, and low signal distortion can be ensured compared to the conventional radio-frequency circuit.

Furthermore, in radio-frequency circuit 1 according to this embodiment, a 5G-NR or 4G-LTE communication band may be applied as communication band B1 and a wireless local area network (WLAN with a frequency range from 5.15 GHz to 7.125 GHz band, hereinafter referred to as a WLAN of at least 5 GHz) may be applied as communication band B2. For example, communication band B1 is B46 with a frequency range from 5.15 GHz to 5.925 GHz, of NR-U, and communication band B2 is a WLAN of at least 5 GHz. It should be noted that NR-U is a 5G-NR band of at least 5 GHz in 3GPP, and corresponds to the U-NII communication band within the unlicensed band of the Federal Communication Commission (FCC).

Furthermore, in radio-frequency circuit 1 according to this embodiment, a WLAN of at least 5 GHz may be applied as communication band B1 and a 5G-NR or 4G-LTE communication band may be applied as communication band B2. For example, communication band B1 is a WLAN (5.15 GHz to 7.125 GHz band) and communication band B2 is B46 of NR-U.

Furthermore, in radio-frequency circuit 1 according to this embodiment, a 5G-NR communication band may be applied as communication band B1 and a 5G-NR communication band may be applied as communication band B2. For example, communication band B1 is n77 of 5G-NR, and communication band B2 is n78 (3300 MHz to 3800 MHz) of 5G-NR. Furthermore, for example, communication band B1 is n257 (26.5 GHz to 29.5 GHz) of 5G-NR, and communication band B2 is n261 (27.5 GHz to 28.35 GHz) of 5G-NR.

It should be noted that a signal modulation scheme for 4G-LTE is, for example, single carrier-frequency division multiple access (SC-FDMA) and a signal modulation scheme for 5G-NR is, for example, cyclic prefix-orthogonal frequency division multiplexing (CP-OFDM). Furthermore, a signal modulation scheme for WLAN is, for example, OFDM. In other words, the signal modulation scheme for 4G-LTE and the signal modulation scheme for 5G-NR, and the signal modulation scheme for WLAN are different from each other.

It should be noted that, in radio-frequency circuit 1 according to this embodiment, n79 (4400 MHz to 5000 MHz) of 5G-NR may be applied as communication band A, n77 of 5G-NR may be applied as communication band B1, and any one of n78 of 5G-NR, B42, B43, B48, and B49 of 4G-LTE may be applied as communication band B2.

According to the above-described configuration, radio-frequency circuit 1 is capable of transferring a 5G-NR radio-frequency signal and a 4G-LTE radio-frequency signal.

For example, by alternately switching between connecting common terminal 13a and selection terminal 13b1 and connecting common terminal 13a and selection terminal 13b2 by switch 13, the radio-frequency signal to be output from one of low-noise amplifier 21B1 and low-noise amplifier 21B2 can be propagated with low loss, without leaking into the other of low-noise amplifier 21B1 and low-noise amplifier 21B2. Furthermore, a radio-frequency signal of communication band A and a radio-frequency signal of communication band B1 can be simultaneously received, and a radio-frequency signal of communication band A and a radio-frequency signal of communication band B2 can be simultaneously received.

For example, by applying B1 (reception band: 2110 MHz to 2170 MHz) of 4G-LTE as communication band A, simultaneous reception for B1 of 4G-LTE and n77 of 5G-NR and simultaneous reception of B1 of 4G-LTE and B42 of 4G-LTE can be alternately executed.

Furthermore, for example, by simultaneously executing connection between common terminal 13a and selection terminal 13b1 and connection between common terminal 13a and selection terminal 13b2 by switch 13, the radio-frequency signal amplified by low-noise amplifier 21B1 and the radio-frequency signal amplified by low-noise amplifier 21B2 can be output simultaneously. For example, n77 of 5G-NR and B42 of 4G-LTE, whose frequency bands are in an inclusion relation, can be simultaneously received (EN-DC).

Furthermore, for the passband of filters 11C and 11D included in multiplexer 11, it is possible to apply any one of wireless LAN (2.4 GHz), wireless LAN (5 GHz) which includes B46 and B47 of LTE, low band group (617 MHz to 960 MHz), GPS (registered trademark)-L1 (1559 MHz to 1606 MHz), GPS-L5 (1166 MHz to 1229 MHz), middle band group (1427 MHz to 2200 MHz), high band group (2300 MHz to 2690 MHz), and ultrahigh band group (3300 MHz to 4990 MHz).

Figure 3A:
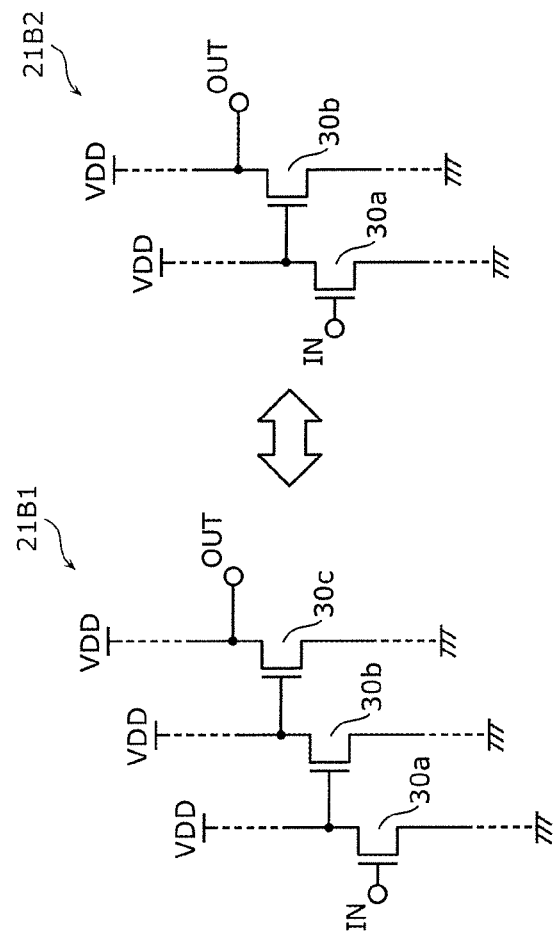
FIG. 3A is an example of a diagram illustrating an example of a circuit configuration of the first low-noise amplifier and the second low-noise amplifier according to the embodiment.

3. Circuit Configuration of Low-Noise Amplifiers 21B1 and 21B2 According to the Embodiment FIG. 3A illustrates an example of a circuit configuration of low-noise amplifiers 21B1 and 21B2 according to the embodiment.

Each of low-noise amplifiers 21B1 and 21B2 includes, for example, field-effect transistors (FET) which have a gate terminal, a drain terminal, and a source terminal, and has a configuration in which a plurality of transistors are connected in multiple stages.

Low-noise amplifier 21B1 includes source-ground FETs 30a, 30b, and 30c which are connected in cascade. The gate terminal of FET 30a is connected to an input terminal, the drain terminal of FET 30a is connected to the gate terminal of FET 30b, the drain terminal of FET 30b is connected to the gate terminal of FET 30c, and the drain terminal of FET 30c is connected to an output terminal. Low-noise amplifier 21B1 includes three transistors connected in multiple stages.

Low-noise amplifier 21B2 includes source-ground FETs 30a and 30b which are connected in cascade. The gate terminal of FET 30a is connected to an input terminal, the drain terminal of FET 30a is connected to the gate terminal of FET 30b, and the drain terminal of FET 30b is connected to an output terminal. Low-noise amplifier 21B2 includes two transistors connected in multiple stages.

Specifically, the number of stages of transistors included in low-noise amplifier 21B1 is different from the number of stages of transistors included in low-noise amplifier 21B2. In this embodiment, the number of stages of transistors included in low-noise amplifier 21B1 is larger than the number of stages of transistors included in low-noise amplifier 21B2.

Because the number of stages of transistors of low-noise amplifier 21B1 and the number of stages of transistors of low-noise amplifier 21B2 are different, the frequency bandwidth in which low-noise amplifiers 21B1 and 21B2 can amplify by at least a predetermined gain can be adjusted. In particular, because the number of stages of transistors included in low-noise amplifier 21B1 is larger than the number of stages of transistors included in low-noise amplifier 21B2, the frequency bandwidth in which low-noise amplifier 21B1 can amplify by a predetermined gain can be adjusted more widely than the frequency bandwidth in which low-noise amplifier 21B2 can amplify by a predetermined gain.

It should be noted that low-noise amplifiers 21B1 and 21B2 may be configured using bipolar amplification transistors. Furthermore, low-noise amplifiers 21B1 and 21B2 may each include a capacitor and an inductor which are connected to a plurality of transistors.

Furthermore, low-noise amplifier 21B1 according to this embodiment may be configured using transistors including GaAs or SiGe, for example. According to this, low-noise amplifier 21B1 can ensure high gain and low distortion characteristics while ensuring a wide frequency band in which amplification by at least a predetermined gain is possible.

On the other hand, low-noise amplifier 21B2 according to this embodiment may be configured using a transistor having a CMOS-SOI (silicon on insulator) structure, for example. According to this, low-noise amplifier 21B2 can ensure high gain, low power consumption, low distortion characteristics, and low cost while ensuring a narrow frequency band in which amplification by at least a predetermined gain is possible.

FIG. 3BA is an outline diagram illustrating an example of a circuit configuration of low-noise amplifier 21B2 according to Variation embodiment 1 of the embodiment and FIG. 3BB illustrates example gain-frequency characteristics thereof. As illustrated in the figure, low-noise amplifier 21B2 according to this variation embodiment includes FETs 30a and 30b, switch 31, and capacitor 32. Compared to low-noise amplifier 21B2 in FIG. 1 according to the embodiment, low-noise amplifier 21B2 in FIG. 3BA according to this variation embodiment is different in configuration only in the addition of switch 31 and capacitor 32, and thus low-noise amplifier 21B2 in FIG. 3BA according to this variation embodiment will be described below omitting the descriptions of elements that are the same as in low-noise amplifier 21B2 in FIG. 1 according to the embodiment and focusing on the elements that are different.

Switch 31 is an example of a second switch, and the circuit in which switch 31 and capacitor 32 are connected in series is connected between the gate terminal of FET 30b and a ground. The circuit in which switch 31 and capacitor 32 are connected in series is a variable capacitance circuit in which the capacitance added to low-noise amplifier 21B2 is variable according to the connection and disconnection of switch 31.

As illustrated in the graph on FIG. 3BB, the frequency band in which amplification by at least a predetermined gain is performed shifts to the low frequency side when switch 31 is placed in the off-state, and the frequency band in which amplification by at least a predetermined gain is performed shifts to the high frequency side when switch 31 is placed in the on-state, for example.

According to this, the frequency band in which amplification by at least a predetermined gain is to be performed can be changed according to the communication band to be used.

It should be noted that the frequency band in which low-noise amplifier 21B2 amplifies a radio-frequency signal by at least the predetermined gain is variable within the frequency band in which low-noise amplifier 21B1 amplifies a radio-frequency signal by at least the predetermined gain.

According to this, the relation in which the frequency band in which low-noise amplifier 21B1 can amplify by at least the predetermined gain includes the frequency band in which low-noise amplifier 21B2 can amplify by at least the predetermined gain is maintained.

It should be noted that the connection point of the variable capacitance circuit is not limited to the gate terminal of FET 30b. Furthermore, the variable capacitance circuit may be a circuit in which switch 31 and capacitor 32 are connected in parallel.

Furthermore, the variable capacitance circuit may be added to low-noise amplifier 21B1 or 21A.

Figure 3C:
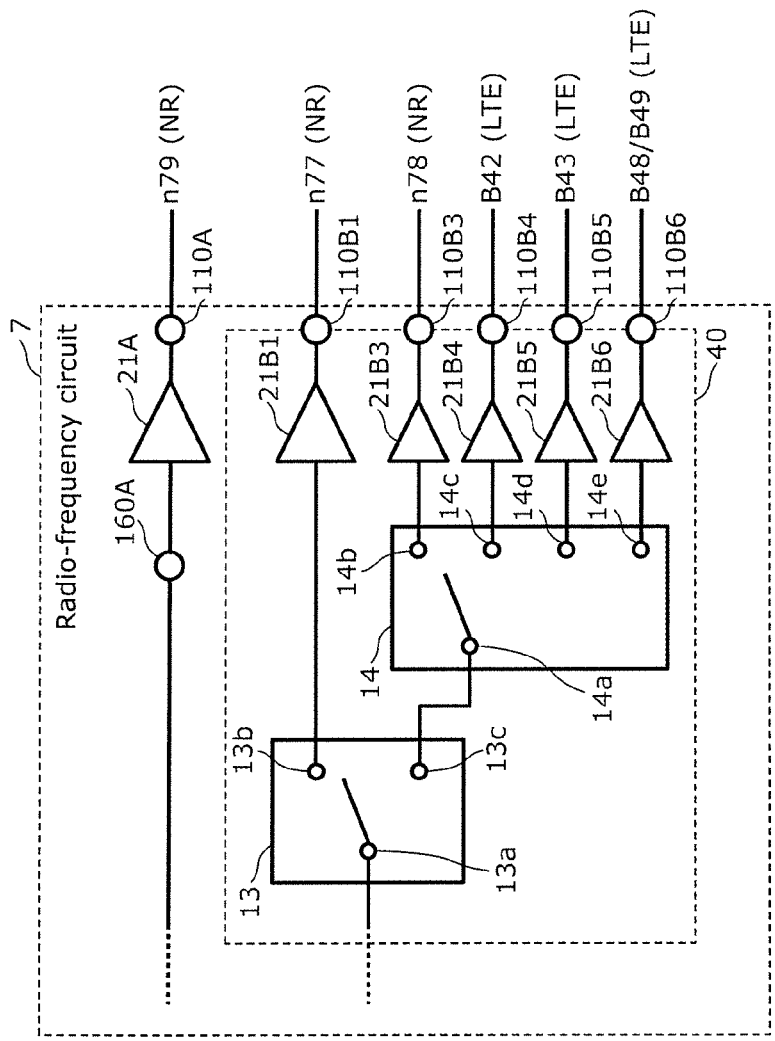
FIG. 3C is an example of a circuit configuration diagram of a radio-frequency circuit according to Variation embodiment 2 of the embodiment.

FIG. 3C is a circuit configuration diagram of radio-frequency circuit 7 according to Variation embodiment 2 of the embodiment. As illustrated in the figure, radio-frequency circuit 7 according to this variation embodiment includes common terminal 100 (illustration omitted), multiplexer 11 (illustration omitted), filter 12A (illustration omitted) and 12B (illustration omitted), switch 13, low-noise amplifiers 21A, 21B1, 21B3, 21B4, 21B5, and 21B6, and reception output terminals 110A, 110B1, 110B3, 110B4, 110B5, and 110B6. Compared to radio-frequency circuit 1 according to the embodiment, radio-frequency circuit 7 according to this variation embodiment is different only in including switch 14 and low-noise amplifiers 21B3 to 21B6 in place of low-noise amplifier 21B2, and thus radio-frequency circuit 7 according to this variation embodiment will be described below omitting the descriptions of elements that are the same as in radio-frequency circuit 1 according to the embodiment and focusing on the elements that are different.

Switch 14, which is an example of a third switch, includes common terminal 14a, selection terminal 14b, selection terminal 14c, selection terminal 14d, and selection terminal 14e, and switches between the connection between common terminal 14a and selection terminal 14b, the connection between common terminal 14a and selection terminal 14c, the connection between common terminal 14a and selection terminal 14d, and the connection between common terminal 14a and selection terminal 14e.

Low-noise amplifier 21B3, which is an example of a first amplifier circuit, includes an input terminal connected to selection terminal 14b and an output terminal connected to reception output terminal 110B3, amplifies a radio-frequency signal input via common terminal 14a and selection terminal 14b and outputs the amplified radio-frequency signal from reception output terminal 110B3 to RFIC 3. The frequency band (corresponding to communication band B1) in which low-noise amplifier 21B3 amplifies radio-frequency signals by at least a predetermined gain includes the frequency band (corresponding to communication band B3) in which low-noise amplifier 21B3 amplifies radio-frequency signals by at least a predetermined gain.

Low-noise amplifier 21B4, which is an example of a second amplifier circuit, includes an input terminal connected to selection terminal 14c and an output terminal connected to reception output terminal 110B4, amplifies radio-frequency signals input via common terminal 14a and selection terminal 14c and outputs the amplified radio-frequency signal from reception output terminal 110B4 to RFIC 3. The frequency band in which low-noise amplifier 21B4 amplifies radio-frequency signals by at least a predetermined gain includes the frequency band (corresponding to communication band B4) in which low-noise amplifier 21B4 amplifies radio-frequency signals by at least a predetermined gain.

Low-noise amplifier 21B5 includes an input terminal connected to selection terminal 14d and an output terminal connected to reception output terminal 110B5, amplifies a radio-frequency signal input via common terminal 14a and selection terminal 14d and outputs the amplified radio-frequency signal from reception output terminal 110B5 to RFIC 3. The frequency band in which low-noise amplifier 21B5 amplifies a radio-frequency signal by at least a predetermined gain includes the frequency band (corresponding to communication band B5) in which low-noise amplifier 21B5 amplifies radio-frequency signals by at least a predetermined gain.

Low-noise amplifier 21B6 includes an input terminal connected to selection terminal 14e and an output terminal connected to reception output terminal 110B6, amplifies a radio-frequency signal input via common terminal 14a and selection terminal 14e and outputs the amplified radio-frequency signals from reception output terminal 110B6 to RFIC 3. The frequency band in which low-noise amplifier 21B6 amplifies a radio-frequency signal by at least a predetermined gain includes the frequency band (corresponding to communication band B6) in which low-noise amplifier 21B6 amplifies radio-frequency signals by at least a predetermined gain.

Furthermore, the frequency band in which low-noise amplifier 21B3 amplifies radio-frequency signals by at least the predetermined gain, the frequency band in which low-noise amplifier 21B4 amplifies a radio-frequency signal by at least the predetermined gain, the frequency band in which low-noise amplifier 21B5 amplifies radio-frequency signals by at least the predetermined gain, and the frequency band in which low-noise amplifier 21B6 amplifies a radio-frequency signal by at least the predetermined gain do not overlap with one another.

In this variation embodiment, for example, n79 of 5G-NR may be applied as communication band A, n77 of 5G-NR may be applied as communication band B1, n78 of 5G-NR may be applied as communication band B3, B42 of 4G-LTE may be applied as communication band B4, B43 of 4G-LTE may be applied as communication band B5, and B48 or B49 (or a band including B48 and B49) of 4G-LTE may applied as communication band B6.

According to this configuration, since each of the frequency bands in which low-noise amplifiers 21B3 to 21B6 amplify radio-frequency signals by at least the predetermined gain is included in the frequency band in which low-noise amplifier 21B1 amplifies radio-frequency signals by at least the predetermined gain, low-noise amplifiers 21B3 to 21B6 are more capable of enhancing amplification performance such as maximum gain, power consumption, and signal distortion. Therefore, for example, compared to a case where the single low-noise amplifier 21B1 amplifies radio-frequency signals of communication band B1 corresponding to the frequency band in which low-noise amplifier 21B1 is capable of amplifying by at least a predetermined gain and radio-frequency signals of the communication band corresponding to the frequency band in which each of low-noise amplifiers 21B3 to 21B6 is capable of amplifying by at least the predetermined gain, high amplification performance such as high gain, low power consumption, and low signal distortion can be obtained.

4. Structure of Filters

Figure 4A:
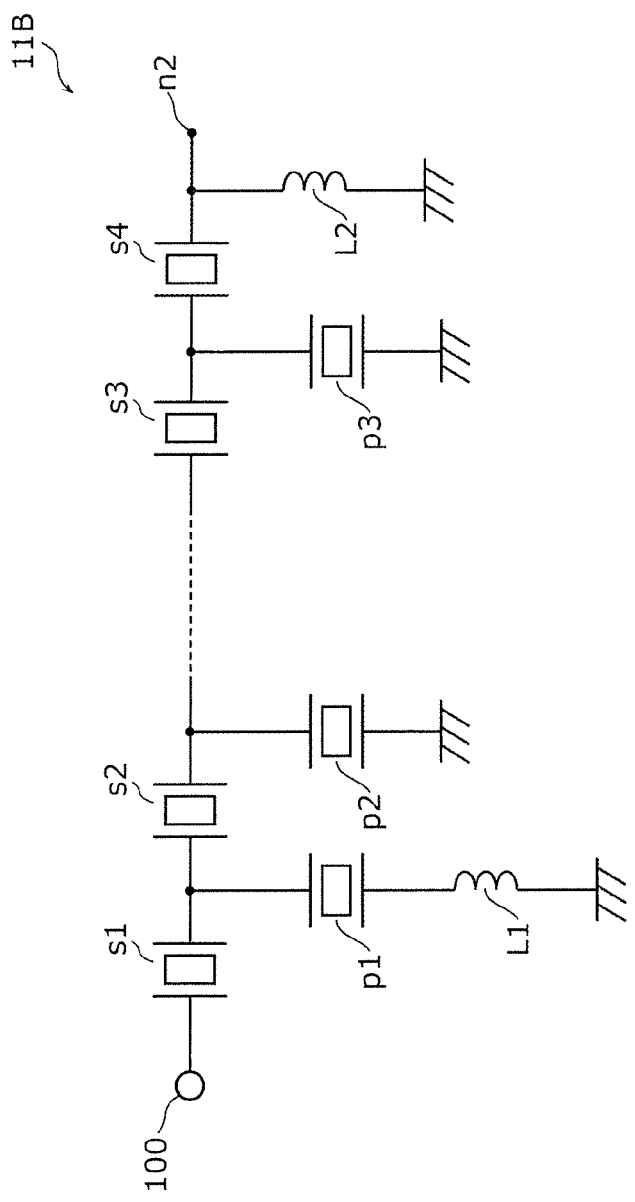
FIG. 4A is a diagram illustrating an example of a circuit configuration of a filter included in a multiplexer according to the embodiment.

FIG. 4A is a diagram illustrating an example of a circuit configuration of filter 11B included in multiplexer 11 according to the embodiment. As illustrated in the figure, filter 11B includes series-arm resonators s1, s2, s3, and s4, parallel-arm resonators p1, p2, and p3, and inductors L1 and L2.

Series-arm resonators s1 to s4 are acoustic wave resonators, and are disposed in series on a path connecting common terminal 100 and connection node n2. Parallel-arm resonators p1 to p3 are acoustic wave resonators, and each is disposed between a ground and a node that is on the path connecting common terminal 100, series-arm resonators s1 to s4, and connection node n2.

Each of serial-arm resonators s1 to s4 and parallel-arm resonators p1 to p3 have a respective resonant frequency in which an impedance becomes minimized and an anti-resonant frequency in which an impedance becomes maximized, and the passband of filter 11B is determined by making the anti-resonant frequencies of parallel-arm resonators p1 to p3 and the resonant frequencies of serial-arm resonators s1 to s4 approximately the same. It should be noted that the number of serial-arm resonators and parallel-arm resonators can vary. Specifically, filter 11B forms a ladder bandpass filter including a plurality of acoustic wave resonators. It should be noted that filter 11B is not limited to a ladder bandpass filter, and may be a longitudinally-coupled filter, and the like.

Inductor L1 is connected between parallel-arm resonator p1 and a ground, and is a passive element for adjusting an attenuation pole in the attenuation band of filter 11B. Inductor L2 is connected between connection node n2 and a ground, and is a passive element for adjusting an attenuation pole in the attenuation band of filter 11B or matching impedances of the circuit elements connected to connection node n2 and filter 11B. It should be noted that in place of inductors L1 and L2, capacitors may be provided, or both an inductor and a capacitor may be provided.

In other words, the passband of filter 11B in this example is determined according to parallel-arm resonators p1 to p3 and serial-arm resonators s1 to s4 only. On the other hand, the attenuation band of filter 11B in this example is determined according to parallel-arm resonators p1 to p3, serial-arm resonators s1 to s4, as well as inductors L1 and L2.

The above-described structure makes it possible to miniaturize and reduce the cost of multiplexer 11 which includes filter 11B.

It should be noted that, in filter 11B in this example, a switch may be connected to at least one of the acoustic wave resonators, inductor L1, or inductor L2. In this case, for example, the passband of filter 11B can be changed by switching one of the aforementioned switches in accordance with the switching of the communication band to be used.

Furthermore, in filter 11B in this example, inductors L1 and L2 are not necessary, and filter 11B may be formed with only acoustic wave resonators.

Furthermore, each of filters 11A, 11C, and 11D may have the structure that filter 11B in this example has. By providing filters 11A to 11D with the above-described structure, multiplexer 11 can be integratedly provided on a single piezoelectric substrate, thereby promoting miniaturization.

Figure 4B:
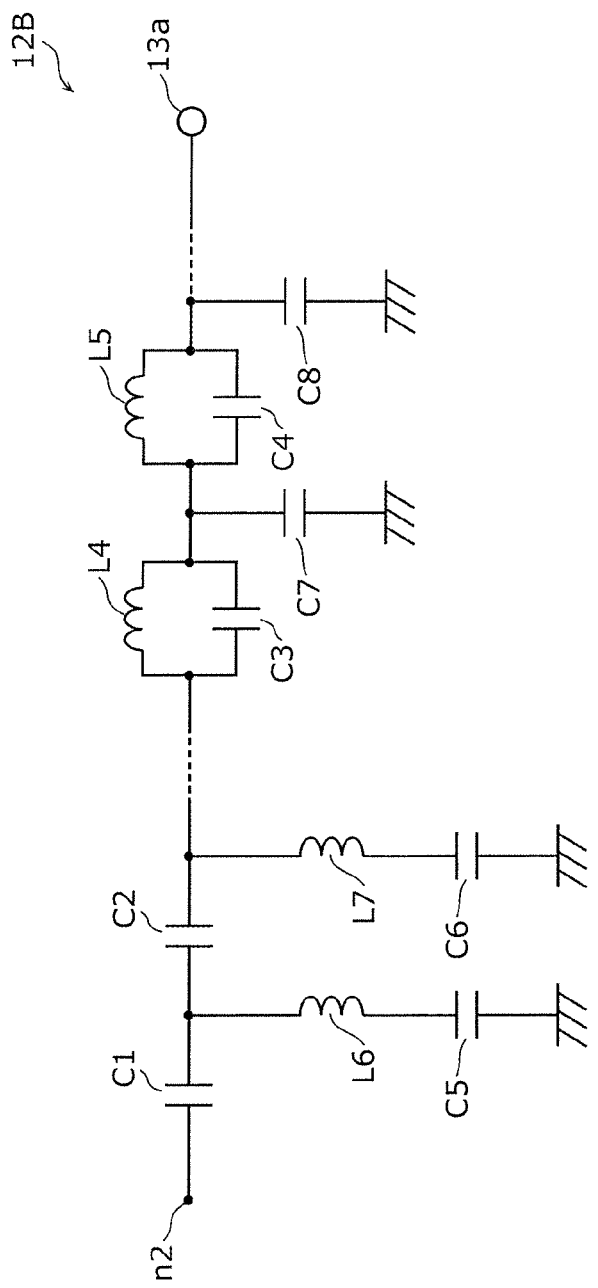
FIG. 4B is a diagram illustrating an example of a circuit configuration of a first filter according to the embodiment.

FIG. 4B is diagram illustrating an example of a circuit configuration of filter 12B according to the embodiment. As illustrated in the figure, filter 12B includes capacitors C1, C2, C3, C4, C5, C6, C7, and C8, and inductors L4, L5, L6, and L7.

Capacitor C1, capacitor C2, the parallel circuit of inductor L4 and capacitor C3, and the parallel circuit of inductor L5 and capacitor C4 are disposed in series on the path connecting connection node n2 and common terminal 13a. The series circuit of inductor L6 and capacitor C5, the series circuit of inductor L7 and capacitor C6, capacitor C7, and capacitor C8 are each disposed between a ground and a node on the path connecting connection node n2 and common terminal 13a.

Inductor L4 and capacitor C3 form an LC parallel resonance circuit. Inductor L5 and capacitor C4 form an LC parallel resonance circuit. Inductor L6 and capacitor C5 form an LC series resonance circuit. Inductor L7 and capacitor C6 form an LC series resonance circuit.

The passband and attenuation band of filter 12B are determined by adjusting the resonant frequencies of the LC parallel resonance circuits and the resonant frequencies of the LC series resonance circuits. It should be noted that although the number and connection relationship of the inductors and capacitors can vary, it is desirable to include at least one of the LC parallel resonance circuits or the LC series resonance circuits. According to this configuration, the LC series resonant frequencies or the LC parallel resonant frequencies can be used as attenuation poles, and thus a wider attenuation band can be realized.

It should be noted that, in filter 12B in this example, a switch may be connected to at least one of the inductors and or at least one of the capacitors. In this case, for example, the passband of filter 12B can be changed by switching one of the aforementioned switches in accordance with the switching of the communication band to be used. Furthermore, the unnecessary waves of the radio-frequency signals to be input to low-noise amplifiers 21B1 and 21B2 can be suppressed in accordance with the switching of the communication band to be used.

Furthermore, filter 12A may also have the structure described in this example.

5. Configuration of Radio-Frequency Circuit 6 According to Variation 3

Figure 5:
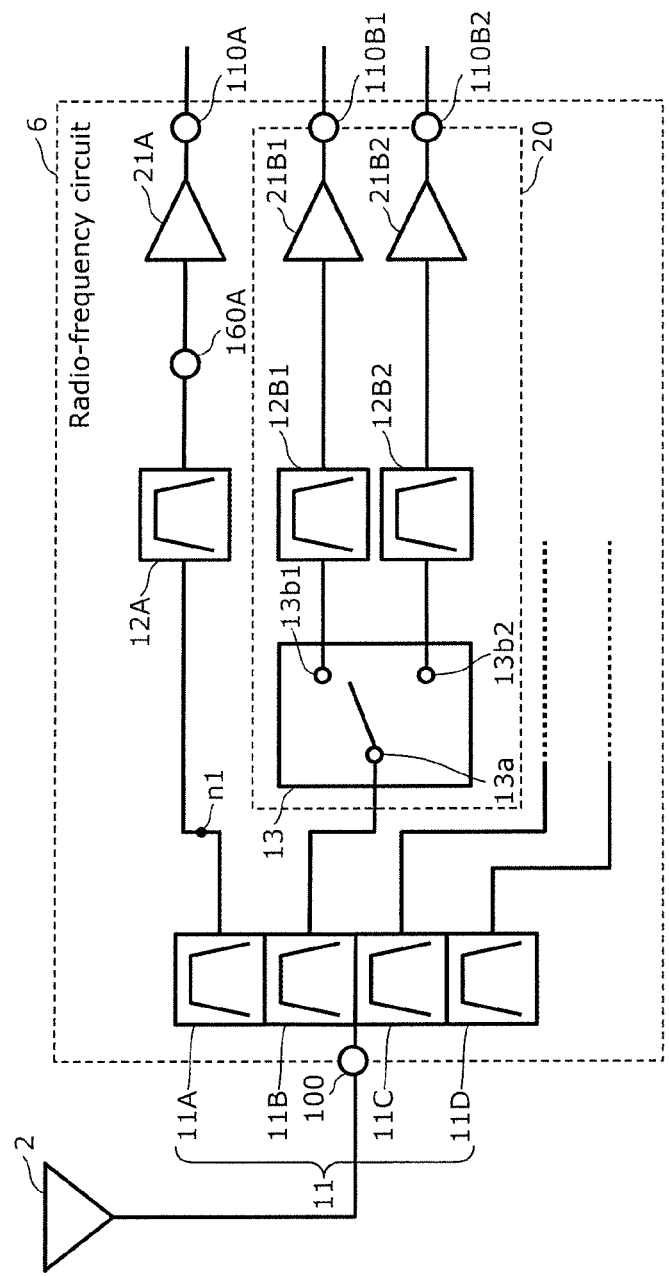
FIG. 5 is a circuit configuration diagram of a radio-frequency circuit and an antenna element according to Variation embodiment 3 of the embodiment.

FIG. 5 is an example of a circuit configuration diagram of radio-frequency circuit 6 and antenna element 2 according to Variation embodiment 3 of the embodiment. As illustrated in the figure, radio-frequency circuit 6 according to this variation embodiment includes common terminal 100, multiplexer 11, filters 12A, 12B1, and 12B2, switch 13, low-noise amplifiers 21A, 21B1, and 21B2, and reception output terminals 110A, 110B1, and 110B2.

Compared to radio-frequency circuit 1 according to the embodiment, radio-frequency circuit 6 according to this variation embodiment is different in configuration only in that filters 12B1 and 12B2 are provided in place of filter 12B, and thus radio-frequency circuit 6 according to this variation embodiment will be described below omitting elements that are the same as those in radio-frequency circuit 1 according to the embodiment and focusing on the elements that are different.

Low-noise amplifier 21B1, which is an example of a first low-noise amplifier, includes an input terminal (a first input terminal) connected to selection terminal 13$b1$ via filter 12B1, and an output terminal (a first output terminal) connected to reception output terminal 110B1. Low-noise amplifier 21B1 is capable of amplifying radio-frequency signals of communication band B1, for example.

Low-noise amplifier 21B2, which is an example of a second low-noise amplifier, includes an input terminal (second input terminal) connected to selection terminal 13$b2$ via filter 12B2, and an output terminal (second output terminal) connected to reception output terminal 110B2. Low-noise amplifier 21B2 is capable of amplifying radio-frequency signals of communication band B2, for example.

Here, the frequency band in which low-noise amplifier 21B1 amplifies radio-frequency signals by at least a predetermined gain includes the frequency band in which low-noise amplifier 21B2 amplifies radio-frequency signals by at least the predetermined gain. Correspondingly, communication band B1 includes communication band B2.

According to this configuration, the frequency band in which at least the predetermined gain is achieved is narrower for low-noise amplifier 21B2 than for low-noise amplifier 21B1, and thus low-noise amplifier 21B2 is more capable of enhancing amplification performance such as maximum gain, power consumption, and signal distortion. Therefore, according to radio-frequency circuit 6 according to this variation, it is possible to obtain high amplification performance such as high gain, low power consumption, and low signal distortion compared to, for example, the case where the single low-noise amplifier 21B1 amplifies radio-frequency signals of communication band B1 corresponding to the frequency band in which low-noise amplifier 21B1 is capable of amplifying by at least a predetermined gain and radio-frequency signals of communication band B2 corresponding to the frequency band in which low-noise amplifier 21B2 is capable of amplifying by at least a predetermined gain. Furthermore, since filters 12B1 and 12B2 corresponding to the respective frequency bands in which low-noise amplifiers 21B1 and 21B2 are capable of amplifying by at least a predetermined gain are disposed upstream of low-noise amplifiers 21B1 and 21B2, it becomes possible to suppress the unnecessary waves of the radio-frequency signals to be input to low-noise amplifiers 21B1 and 21B2, and the S/N ratio of the radio-frequency signals output from low-noise amplifiers 21B1 and 21B2 improves.

It should be noted that switch 13, filters 12B1 and 12B2, and low-noise amplifiers 21B1 and 21B2 may be radio-frequency module 20 obtained by forming switch 13, filters 12B1 and 12B2, and low-noise amplifiers 21B1 and 21B2 on the same substrate. Furthermore, switch 13 and low-noise amplifiers 21B1 and 21B2 may be configured using a semiconductor IC formed on a single chip.

6. Advantageous Effects

As described above, according to this embodiment, radio frequency circuit 1 includes: switch 13 that includes common terminal 13a, selection terminal 13b1 and selection terminal 13b2 and switches between connecting common terminal 13a and selection terminal 13b1 and connecting common terminal 13a and selection terminal 13b2; low-noise amplifier 21B1 including an input terminal connected to selection terminal 13b1; and low-noise amplifier 21B2 including an input terminal connected to selection terminal 13b2. Here, the frequency band in which low-noise amplifier 21B1 amplifies radio-frequency signals by at least a predetermined gain includes the frequency band in which low-noise amplifier 21B2 amplifies radio-frequency signals by at least a predetermined gain.

According to this, the frequency band in which at least the predetermined gain is achieved is narrower for low-noise amplifier 21B2 than for low-noise amplifier 21B1, and thus low-noise amplifier 21B2 is more capable of achieving a high maximum gain, a low power consumption, and a low signal distortion. Therefore, the radio-frequency signals can be amplified with high amplification performances compared to, for example, the case where the single low-noise amplifier 21B1 amplifies both radio-frequency signals of communication band B1 corresponding to the frequency band in which low-noise amplifier 21B1 is capable of amplifying by at least a predetermined gain and radio-frequency signals of communication band B2 corresponding to the frequency band in which low-noise amplifier 21B2 is capable of amplifying by at least a predetermined gain.

Furthermore, according to this embodiment, low-noise amplifier 21B1 has, as a possible amplification band, a first frequency band in which low-noise amplifier 21B1 is capable of amplifying the radio-frequency signals by at least a gain that is smaller than a maximum gain value of low-noise amplifier 21B1 by a predetermined value, low-noise amplifier 21B2 has, as a possible amplification band, a second frequency band in which the first low-noise amplifier is capable of amplifying the radio-frequency signals by at least a gain that is smaller than a maximum gain value of the second low-noise amplifier by a predetermined value, and the first frequency band includes the second frequency band.

According to this configuration, a high gain, a low power consumption, and a low signal distortion can be obtained compared to, for example, the case where the single low-noise amplifier 21B1 amplifies both the radio-frequency signals of communication band B1 corresponding to the first frequency band and the radio-frequency signals of communication band B2 corresponding to the second frequency band.

Furthermore, according to this embodiment, radio frequency circuit 1 may further include filter 12B that is connected to common terminal 13a and has a passband that includes the first frequency band.

According to this configuration, unnecessary waves of radio-frequency signals to be input to low-noise amplifiers 21B1 and 21B2 can be suppressed upstream of low-noise amplifiers 21B1 and 21B2, and thus the S/N ratio of the radio-frequency signals output from low-noise amplifiers 21B1 and 21B2 improves.

Furthermore, according to this embodiment, the passband of filter 12B may be variable.

According to this configuration, the unnecessary waves of the radio-frequency signals to be input to low-noise amplifiers 21B1 and 21B2 can be suppressed according to the communication band to be used.

Furthermore, according to this embodiment, the first frequency band may be a frequency band that includes n77 of NR, and the second frequency band may be a frequency band that includes at least one of n78 of NR, B42 of LTE, B43 of LTE, B48 of LTE, or B49 of LTE.

According to this configuration, a 5G-NR radio-frequency signal and a 4G-LTE radio-frequency signal can be amplified with high amplifier performance.

Furthermore, according to this embodiment, low-noise amplifier 21B1 and low-noise amplifier 21B2 may each include a plurality of transistors connected in multiple stages, and the number of stages of the plurality of transistors included in low-noise amplifier 21B1 may be different from the number of stages of the plurality of transistors included in low-noise amplifier 21B2.

According to this configuration, the frequency bandwidths of low-noise amplifiers 21B1 and 21B2 can be adjusted through the number of stages of the transistors.

Furthermore, according to Variation embodiment 1 of this embodiment, at least one of low-noise amplifier 21B1 or low-noise amplifier 21B2 may further include a variable-capacitance circuit having a capacitance that is variable, and the variable-capacitance circuit may include capacitor 32 and switch 31 connected to capacitor 32.

According to this configuration, the frequency band in which amplification by at least a predetermined gain is to be performed can be changed according to the communication band to be used.

Furthermore, according to Variation embodiment 1 of this embodiment, low-noise amplifier 21B2 may include the variable-capacitance circuit, and the frequency band in which low-noise amplifier 21B2 amplifies the radio-frequency signals by at least a predetermined gain may be variable within the frequency band in which low-noise amplifier 21B1 amplifies the radio-frequency signals by at least a predetermined gain, according to switching of switch 31 between an on-state and an off-state.

According to this configuration, the relation in which the frequency band in which low-noise amplifier 21B1 can amplify by at least the predetermined gain includes the frequency band in which low-noise amplifier 21B2 can amplify by at least the predetermined gain is maintained.

Furthermore, according to this embodiment, switch 13 may switch alternately between connecting common terminal 13a and selection terminal 13b1 and connecting common terminal 13a and selection terminal 13b2.

According to this configuration, the radio-frequency signal output from one of low-noise amplifiers 21B1 and 21B2 can be propagated with low loss, without leaking into the other of low-noise amplifiers 21B1 and 21B2.

Furthermore, according to this embodiment, in switch 13, common terminal 13a may be connected to both selection terminal 13b1 and selection terminal 13b2.

According to this configuration, the radio-frequency signal amplified by low-noise amplifier 21B1 and the radio-frequency signal amplified by low-noise amplifier 21B2 can be output simultaneously.

Furthermore, according to this embodiment, radio frequency circuit 1 includes: switch 13 that includes common terminal 13a, selection terminal 13b1 and selection terminal 13b2 and switches between connecting common terminal 13a and selection terminal 13b1 and connecting common terminal 13a and selection terminal 13b2; low-noise amplifier 21B1 including an input terminal connected to selection terminal 13b1; and low-noise amplifier 21B2 including an input terminal connected to selection terminal 13b2. Low-noise amplifier 21B1 and low-noise amplifier 21B2 each include a plurality of transistors connected in multiple stages, and the number of stages of the plurality of transistors included in low-noise amplifier 21B1 is different from the number of stages of the plurality of transistors included in low-noise amplifier 21B2.

According to this configuration, since the number of stages of the transistors of low-noise amplifiers 21B1 and 21B2 are different, the frequencies in which low-noise amplifiers 21B1 and 21B2 amplify by at least a predetermined gain are different. Specifically, maximum gain, power consumption, and signal distortion characteristics are different between low-noise amplifier 21B1 and low-noise amplifier 21B2. Therefore, high gain, low power consumption, and low signal distortion can be obtained compared to, for example, the case where the single low-noise amplifier 21B1 amplifies both the radio-frequency signal of communication band B1 corresponding to the frequency band in which low-noise amplifier 21B1 is capable of amplifying by at least a predetermined gain and the radio-frequency signal of communication band B2 corresponding to the frequency band in which low-noise amplifier 21B2 is capable of amplifying by at least a predetermined gain.

Furthermore, according to this embodiment, radio-frequency circuit 1 may further include filter 12B that is connected to common terminal 13 and has a passband that includes (i) a frequency band in which low-noise amplifier 21B1 is capable of amplifying a radio-frequency signal by at least a predetermined gain and (ii) a frequency band in which low-noise amplifier 21B2 is capable of amplifying a radio-frequency signal by at least a predetermined gain.

According to this configuration, unnecessary waves of radio-frequency signals to be input to low-noise amplifiers 21B1 and 21B2 can be suppressed upstream of low-noise amplifiers 21B1 and 21B2, and thus the S/N ratio of the radio-frequency signals output from low-noise amplifiers 21B1 and 21B2 improves.

Furthermore, according to this embodiment, radio-frequency circuit 1 may further include: multiplexer 11 disposed upstream of common terminal 13a of switch 13. Multiplexer 11 may include at least two filters 11A and 11B that have non-overlapping passbands and including input terminals that are in a common connection. Filter 11B may include an output terminal connected to common terminal 13a, and have a passband that includes a frequency band in which low-noise amplifier 21B1 is capable of amplifying a radio-frequency signal by at least a predetermined gain and a frequency band in which low-noise amplifier 21B2 is capable of amplifying a radio-frequency signal by at least a predetermined gain.

According to this, filter 11B can suppress unnecessary waves of radio-frequency signals to be input to low-noise amplifiers 21B1 and 21B2 upstream of low-noise amplifiers 21B1 and 21B2, and thus the S/N ratio of the radio-frequency signals output from low-noise amplifiers 21B1 and 21B2 improves. Furthermore, multiplexer 11 makes it possible to multiplex and simultaneously receive radio-frequency signals of two or more communication bands.

Furthermore, according to this embodiment, communication device 5 includes: RFIC 3 that processes a radio-frequency signal received by antenna element 2; and radio-frequency circuit 1 that propagates the radio-frequency signal between antenna element 3 and RFIC 3.

Accordingly, it is possible to provide a communication device capable of amplifying radio-frequency signals with high amplification performance.

OTHER EMBODIMENTS

Although the radio-frequency circuit and communication device according to the present disclosure have been described above based on an exemplary embodiment and variations thereof, the present disclosure is not limited to the foregoing embodiment to the exemplary embodiment and the variations thereof. The present disclosure also encompasses other embodiments achieved by combining arbitrary elements in the above embodiment and variations thereof, variations resulting from various modifications to the embodiment and variations thereof that may be conceived by those skilled in the art without departing from the essence of the present disclosure, and various devices that include the radio-frequency circuit and the communication device according to the present disclosure.

For example, regardless of how large or small the number of stages of the transistors included in low-noise amplifier 21B1 and the number of stages of the transistors included in low-noise amplifier 21B2, low-noise amplifier 21B1 may be configured using transistors including GaAs or SiGe for example, and low-noise amplifier 21B2 may include transistors having a CMOS-SOI structure. According to this, low-noise amplifier 21B1 can ensure high gain and low distortion characteristics, and low cost while ensuring a wide frequency band in which amplification by at least a predetermined gain is possible, and low-noise amplifier 21B2 can ensure high gain, low power consumption, low distortion characteristics, and low cost while ensuring a narrow frequency band in which amplification by at least a predetermined gain is possible.

For example, in the radio-frequency circuit and communication device according to the exemplary embodiment and the variations thereof, a matching element such as an inductor and capacitor, as well as a switch circuit may be connected between the respective elements. It should be noted that the inductor may include a wire inductor configured by a wire that connects respective elements.

Moreover, in the forgoing embodiment, communication system means a communication system constructed using radio access technology (RAT) defined by a standards organization, etc. (for example, 3GPP or Institute of Electrical and Electronic Engineers (IEEE)). The communication system can use, for example, a 5G-NR system, a 4G-LTE system, a WLAN system, etc., but is not limited to these.

Furthermore, communication band means a frequency band that is defined in advance by a standards organization, etc., for a communication system. The communication band can use, for example, a 5G-NR frequency band, a 4G-LTE frequency band, etc., but is not limited to these.

The present disclosure, as a radio-frequency circuit and a communication device that can be applied to a multiband system, can be widely used in communication apparatuses such as a mobile phone.

The invention claimed is:
1. A radio-frequency circuit, comprising:
a first switch including a common terminal, a first selection terminal, and a second selection terminal, the first switch configured to switch between connecting the common terminal and the first selection terminal and connecting the common terminal and the second selection terminal;
a first low-noise amplifier including an input terminal connected to the first selection terminal; and
a second low-noise amplifier including an input terminal connected to the second selection terminal,
wherein a first bandwidth in which the first low-noise amplifier is configured to amplify radio-frequency signals by at least a first predetermined gain, is greater than a second bandwidth in which the second low-noise amplifier is configured to amplify radio-frequency signals by at least a second predetermined gain, and
the first predetermined gain is equal to the second predetermined gain.

2. The radio-frequency circuit according to claim 1, wherein:
the first low-noise amplifier has, as a possible amplification band, a first frequency band in which the first low-noise amplifier is configured to amplify radio-frequency signals by at least a gain that is smaller than a maximum gain value of the first low-noise amplifier by a first predetermined value,
the second low-noise amplifier has, as a possible amplification band, a second frequency band in which the second low-noise amplifier is configured to amplify radio-frequency signals by at least a gain that is smaller than a maximum gain value of the second low-noise amplifier by a second predetermined value, and
the first frequency band includes the second frequency band.

3. The radio-frequency circuit according to claim 2, further comprising:
a first filter connected to the common terminal, the first filter having a passband that includes the first frequency band.

4. The radio-frequency circuit according to claim 3, wherein the passband of the first filter is variable.

5. The radio-frequency circuit according to claim 2, wherein a first communication system of the radio-frequency signals amplified by the first low-noise amplifier and a second communication system of the radio-frequency signals amplified by the second low-noise amplifier are different, and are any one of the following:
(1) the first communication system is fifth-generation mobile communication system (5G)-new radio (NR) and the second communication system is fourth-generation mobile communication system (4G)-long term evolution (LTE);
(2) the first communication system is one of the 5G-NR and the 4G-LTE and the second communication system is wireless local area network (WLAN) of at least 5 GHz; or
(3) the first communication system is the WLAN with a radio frequency of at least 5 GHz and the second communication system is one of the 5G-NR and the 4G-LTE.

6. The radio-frequency circuit according to claim 2, wherein a first communication system of the radio-frequency signals amplified by the first low-noise amplifier and a second communication system of the radio-frequency signals amplified by the second low-noise amplifier are both fifth-generation mobile communication system (5G)-new radio (NR).

7. The radio-frequency circuit according to claim 6, wherein the first communication system is n257, having a frequency range from 26.5 GHz to 29.5 GHz, of the 5G-NR and the second communication system is n261, having a frequency range from 27.5 GHz to 28.35 GHz, of the 5G-NR.

8. The radio-frequency circuit according to claim 2, wherein:
the first frequency band includes n77, having a frequency range from 3300 MHz to 4200 MHz, of the NR, and
the second frequency band includes at least one of n78, having a frequency range from 3300 MHz to 3800 MHz, of the NR, B42, having a frequency range from 3400 MHz to 3600 MHz, of the LTE, B43, having a frequency range from 3600 MHz to 3800 MHz, of the LTE, B48, having a frequency range from 3550 MHz to 3700 MHz, of the LTE, or B49, having a frequency range from 3550 MHz to 3700 MHz, of the LTE.

9. The radio-frequency circuit according to claim 1, wherein:
the first low-noise amplifier includes a plurality of transistors connected in multiple stages, and the second low-noise amplifier includes a plurality of transistors connected in multiple stages, and
a total number of stages of the plurality of transistors included in the first low-noise amplifier is different from a total number of stages of the plurality of transistors included in the second low-noise amplifier.

10. The radio-frequency circuit according to claim 9, wherein:
at least one of the first low-noise amplifier or the second low-noise amplifier further includes a variable-capacitance circuit having a capacitance that is variable, and
the variable-capacitance circuit includes:
a capacitor; and
a second switch connected to the capacitor.

11. The radio-frequency circuit according to claim 10, wherein:
the second low-noise amplifier includes the variable-capacitance circuit, and
the second bandwidth in which the second low-noise amplifier is configured to amplify radio-frequency signals by at least the second predetermined gain is variable within the first bandwidth in which the first low-noise amplifier amplifies radio-frequency signals by at least the first predetermined gain, according to switching of the second switch between an on-state and an off-state.

12. The radio-frequency circuit according to claim 1, wherein the first switch switches alternately between connecting the common terminal and the first selection terminal and connecting the common terminal and the second selection terminal.

13. The radio-frequency circuit according to claim 1, wherein in the first switch, the common terminal is connected to both the first selection terminal and the second selection terminal.

14. A communication device, comprising:
an RF signal processing circuit configured to process a radio-frequency signal received by an antenna element; and
the radio-frequency circuit according to claim 1 configured to propagate the radio-frequency signal between the antenna element and the RF signal processing circuit.

15. A radio-frequency circuit, comprising:
a first switch including a common terminal, a first selection terminal, and a second selection terminal, and configured to switch between connecting the common terminal and the first selection terminal and connecting the common terminal and the second selection terminal;
a first low-noise amplifier including an input terminal connected to the first selection terminal;
a second low-noise amplifier including an input terminal connected to the second selection terminal; and
a first filter connected to the common terminal, the first filter having a passband that includes frequency bands which the first low-noise amplifier and second low-noise amplifier are configured to amplify,
wherein the first low-noise amplifier and the second low-noise amplifier each include a plurality of transistors connected in multiple stages,
wherein a total number of stages of the plurality of transistors included in the first low-noise amplifier is different from a total number of stages of the plurality of transistors included in the second low-noise amplifier,
wherein a first bandwidth in which the first low-noise amplifier is configured to amplify radio-frequency signals by at least a first predetermined gain, is greater than a second bandwidth in which the second low-noise amplifier is configured to amplify radio-frequency signals by at least a second predetermined gain, and
wherein the first predetermined gain is equal to the second predetermined gain.

16. The radio-frequency circuit according to claim 15, further comprising:
a multiplexer disposed upstream of the common terminal of the first switch, wherein:
the multiplexer includes at least two filters having non-overlapping passbands, the at least two filters including input terminals that are in a common connection,
one filter, among the at least two filters, includes an output terminal connected to the common terminal, the one filter having a passband that includes a frequency band in which the first low-noise amplifier is configured to amplify a radio-frequency signal by at least a predetermined gain and a frequency band in which the second low-noise amplifier is configured to amplify a radio-frequency signal by at least a predetermined gain.

* * * * *